US010868537B1

(12) United States Patent
Eid et al.

(10) Patent No.: US 10,868,537 B1
(45) Date of Patent: Dec. 15, 2020

(54) SUPPLY VOLTAGE AND TEMPERATURE INDEPENDENT RECEIVER

(71) Applicant: Apple Inc., Cupertino, CA (US)

(72) Inventors: Fahmy Mohammed Eid, Munich (DE); Jerome Casters, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/930,830

(22) Filed: Jul. 16, 2020

(51) Int. Cl.
*H03K 19/0948* (2006.01)
*H04L 13/18* (2006.01)
*H03K 19/00* (2006.01)

(52) U.S. Cl.
CPC ..... *H03K 19/0948* (2013.01); *H03K 19/0027* (2013.01); *H04L 13/18* (2013.01)

(58) Field of Classification Search
CPC .................................................. H03K 19/0948
See application file for complete search history.

(56) References Cited

U.S. PATENT DOCUMENTS

| 5,486,774 | A | * | 1/1996 | Douseki | H03K 19/0016 326/33 |
| 6,307,409 | B1 | * | 10/2001 | Wrathall | H03K 17/08122 326/27 |
| 7,332,953 | B2 | | 2/2008 | Pineda De Gyvez et al. | |
| 8,174,291 | B1 | | 5/2012 | Shah et al. | |
| 8,884,658 | B2 | * | 11/2014 | Tang | H03K 17/107 327/108 |
| 9,628,081 | B2 | | 4/2017 | Jain et al. | |

* cited by examiner

*Primary Examiner* — Hai L Nguyen
(74) *Attorney, Agent, or Firm* — Fenwick & West LLP (57) ABSTRACT

Embodiments relate to a circuitry for digital data communication. The circuitry includes an inverter circuit connected between an input node and an output node. The inverter circuit has core circuits each of which includes a complementary metal-oxide-semiconductor (CMOS) transistor of a first type and a CMOS transistor of a second type having a first common gate node connected to the input node and a first common drain node connected to the output node. The circuitry further includes another inverter circuit of a switching threshold voltage different than that of the inverter circuit and connected between the input node and the output node. The other inverter circuit has core circuits each of which includes a CMOS transistor of a third type and a CMOS transistor of a fourth type having a second common gate node connected to the input node and a second common drain node connected to the output node.

20 Claims, 8 Drawing Sheets

SUPPLY VOLTAGE AND TEMPERATURE INDEPENDENT RECEIVER

BACKGROUND

1. Field of the Disclosure

The present disclosure relates to a complementary metal-oxide-semiconductor (CMOS) based receiver circuit that operates in a consistent manner despite supply voltage and temperature fluctuations.

2. Description of the Related Art

Integrated circuits for digital data communication typically include inverter based receiver circuits that include CMOS logic. A digital receiver that includes a CMOS based inverter circuit is easy to port across components and nodes implemented using different technologies, as well as across components operating under different conditions. The additional advantage of the receiver including the conventional CMOS based inverter circuit is that there is no static power consumption when the CMOS based inverter circuit is not utilized (e.g., disabled). However, operation of the conventional CMOS based inverter circuit is typically dependent on temperature as well as voltage supply ripples and other variations.

SUMMARY

Embodiments relate to a circuitry that includes an input node for receiving an input voltage signal, an output node for outputting an output voltage signal, a first inverter circuit and a second inverter circuit. The first inverter circuit has a first switching threshold voltage and is connected between the input node and the output node. The first inverter circuit includes a first set of one or more core circuits. Each core circuit of the first set includes a complementary metal-oxide-semiconductor (CMOS) transistor of a first type (e.g., of a first threshold voltage) and a CMOS transistor of a second type (e.g., of a second threshold voltage) that have a first common gate node connected to the input node and a first common drain node connected to the output node. The second inverter circuit has a second switching threshold voltage lower than the first switching threshold voltage and it is also connected between the input node and the output node. The second inverter circuit includes a second set of one or more core circuits. Each core circuit of the second set includes a CMOS transistor of a third type (e.g., of a third threshold voltage) and a CMOS transistor of a fourth type (e.g., of a fourth threshold voltage) that have a second common gate node connected to the input node and a second common drain node connected to the output node.

The figures depict, and the detailed description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a circuitry of an electronic device for digital data communication, e.g., for reception of digital data. The circuitry includes a receiver implemented as a complementary metal-oxide-semiconductor (CMOS) inverter circuit. The operation of CMOS inverter circuit presented herein is temperature independent as well as independent on voltage supply variations and ripples. The circuitry includes an input node that receives an input voltage signal and an output node that outputs an output voltage signal. The circuitry further includes a first inverter circuit of a first switching threshold voltage connected between the input node and the output node. The first inverter circuit includes a first set of one or more core circuits, each core circuit of the first set including a CMOS transistor of a first type (e.g., of a first threshold voltage) and a CMOS transistor of a second type (e.g., of a second threshold voltage) having a first common gate node connected to the input node and a first common drain node connected to the output node. The circuitry further includes a second inverter circuit of a second switching threshold voltage lower than the first switching threshold voltage connected between the input node and the output node. The second inverter circuit includes a second set of one or more core circuits, each core circuit of the second set including a CMOS transistor of a third type (e.g., of a third threshold voltage) and a CMOS transistor of a fourth type (e.g., of a fourth threshold voltage) having a second common gate node connected to the input node and a second common drain node connected to the output node.

Example Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions.

Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure 1:
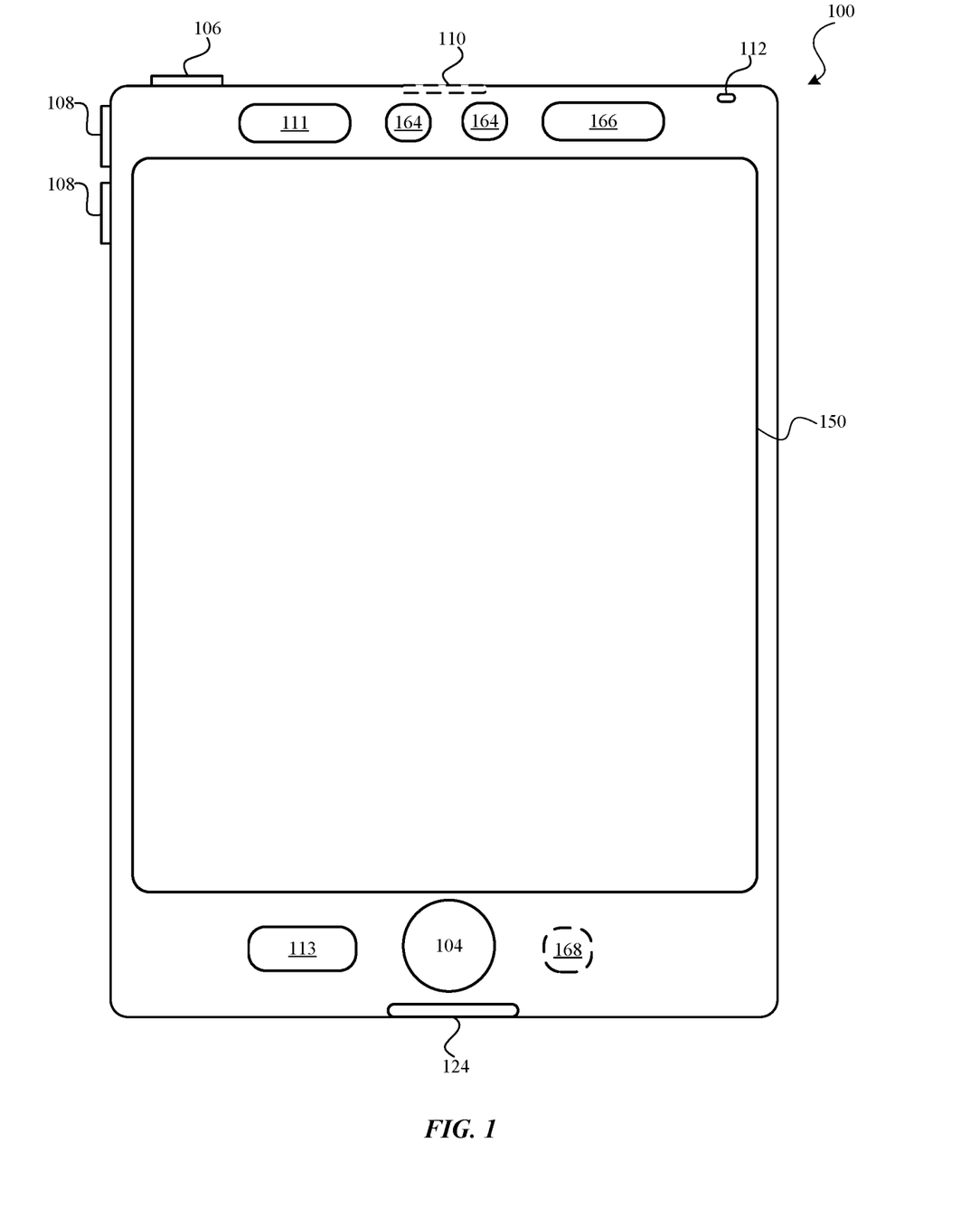
FIG. 1 is a high-level diagram of an electronic device, according to one embodiment.

FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. Device 100 may include more than one type of image sensors 164. Each type may include more than one image sensor 164. For example, one type of image sensors 164 may be cameras and another type of image sensors 164 may be infrared sensors that may be used for face recognition. In addition or alternatively, image sensors 164 may be associated with different lens configuration. For example, device 100 may include rear image sensors, one with a wide-angle lens and another with as a telephoto lens. Device 100 may include components not shown in FIG. 1 such as an ambient light sensor, a dot projector and a flood illuminator.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). While the components in FIG. 1 are shown as generally located on the same side as touch screen 150, one or more components may also be located on an opposite side of device 100. For example, front side of device 100 may include an infrared image sensor 164 for face recognition and another image sensor 164 as the front camera of device 100. The back side of device 100 may also include additional image sensors 164 as the rear cameras of device 100.

Example Communication System in Electronic Device

Figure 2:
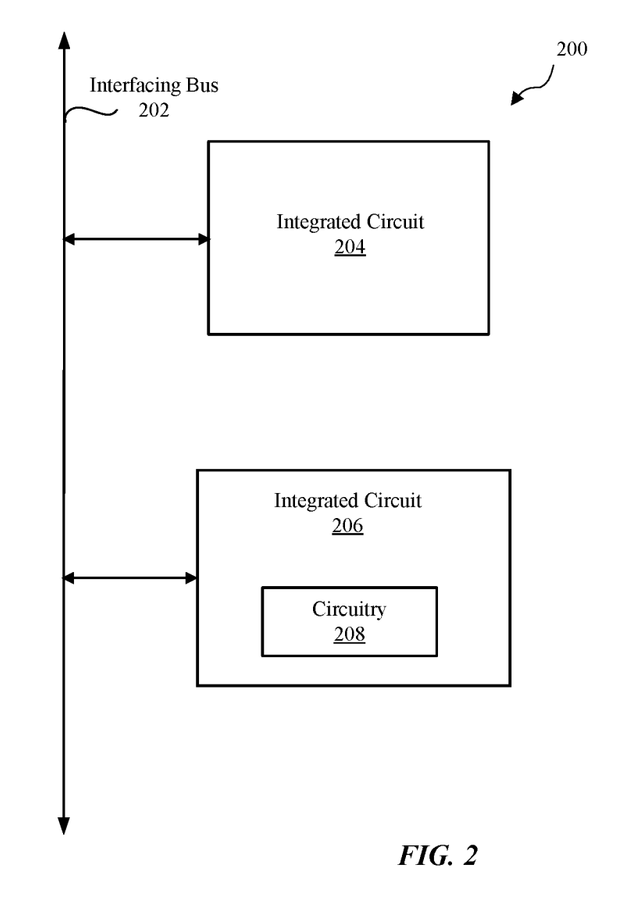
FIG. 2 is a block diagram illustrating components of the electronic device communicating over an interfacing bus, according to one embodiment.

FIG. 2 is a block diagram illustrating components of electronic device 100 communicating over an interfacing bus 202, according to one embodiment. Electronic device 100 may include, among other components, an integrated circuit 204 and an integrated circuit 206 that communicate with each other via interfacing bus 202. The components illustrated in FIG. 2 may be part of, e.g., a communication subsystem in electronic device 100. Electronic device 100 may include additional components (e.g., user interfaces) not illustrated in FIG. 2.

Interfacing bus 202 is a communication channel that enables multiple components to communicate over a shared connection. In one or more embodiments, interfacing bus 202 is implemented as a multi-drop bus, which may be divided into more buses. For example, System Power Management Interface (SPMI) may be used to embody interfacing bus 202. Other serial bus interfaces such as I2C may be used instead of the SPMI to embody interfacing bus 202. Although not illustrated in FIG. 2, integrated circuits 204 and 206 may communicate between each other via one or more point-to-point connections, such as Peripheral Component Interconnect Express (PCIe), I2C, Serial Peripheral Interface (SPI), Universal Asynchronous Receiver-Transmitter (UART) connection, general-purpose input/output (GPIO) connection, or some other point-to-point connection.

Each of integrated circuits 204 and 206 may be signal processing circuit, ASIC circuit, or some other circuit suitable for digital data communication. Integrated circuit 206 may include, among other components, a circuitry 208 for digital data communication, e.g., for reception of digital data from integrated circuit 204. Circuitry 208 may be implemented as a temperature and voltage supply independent complementary metal-oxide-semiconductor (CMOS) based inverter circuit. Details about a CMOS inverter circuit and requirements for its operation to be independent of variations of temperature and voltage supply are provided below in relation to FIGS. 3A-3B. Details about a structure of circuitry 208 implemented as a CMOS inverter based receiver whose operation is independent on variations of temperature and voltage supply are provided in relation to FIG. 4 and FIGS. 5A-5D.

Example Operation of CMOS Inverter Circuit

Figure 3A:
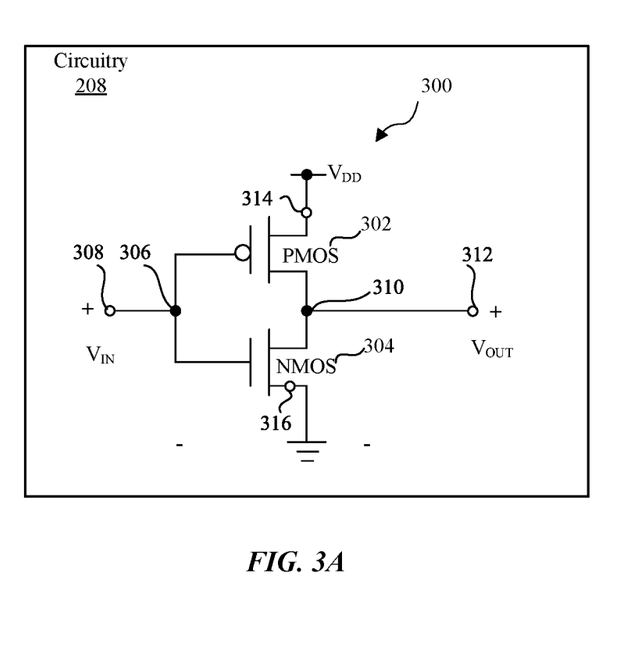
FIG. 3A is a circuit diagram illustrating a complementary metal-oxide-semiconductor (CMOS) inverter, according to one embodiment.

FIG. 3A is a circuit diagram illustrating a CMOS inverter circuit 300, according to one embodiment. CMOS inverter circuit 300 includes a P-type metal-oxide-semiconductor (PMOS) transistor 302 and a N-type metal-oxide-semiconductor (NMOS) transistor 304. PMOS transistor 302 and NMOS transistor 304 have a common gate node 306 connected to an input node 308. Also, PMOS transistor 302 and NMOS transistor 304 have a common drain node 310 connected to an output node 312. A source node 314 of PMOS transistor 302 is connected to a positive voltage supply $V_{DD}$ and a source node 316 of NMOS transistor 304 is connected to a ground node (or a negative voltage supply).

An input voltage signal $V_{IN}$ is received at input node 308, and an output voltage signal $V_{OUT}$ is generated by CMOS inverter circuit 300 at output node 312.

NMOS transistor 304 is turned on when a voltage between gate node 306 and source node 316 (e.g., the input voltage signal $V_{IN}$) is greater than a threshold voltage $V_{Tn}$ (where $V_{Tn}$ is a positive voltage value), and NMOS transistor 304 is turned off when the voltage between gate node 306 and source node 316 is less than the threshold voltage $V_{Tn}$. PMOS transistor 302 is turned on when a voltage between gate node 306 and source node 314 is less than a threshold voltage $V_{Tp}$ (where $V_{Tp}$ is a negative voltage value), and PMOS transistor 302 is turned off when the voltage between gate node 306 and source node 314 is greater than the threshold voltage $V_{Tp}$.

Figure 3B:
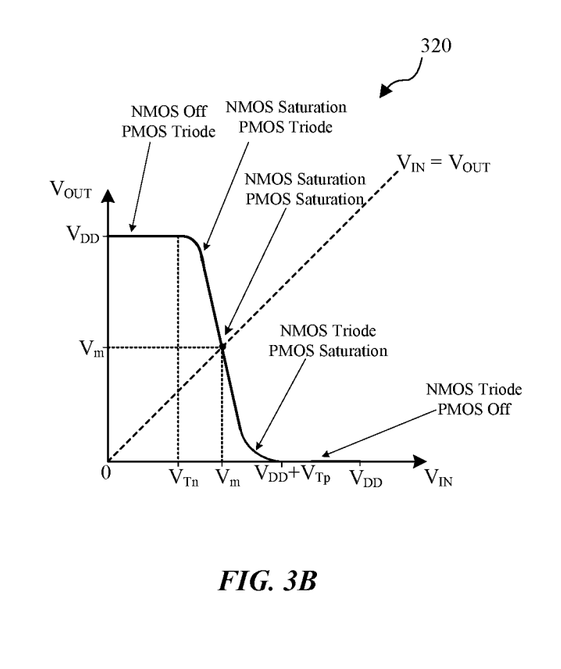
FIG. 3B is graph illustrating a voltage transfer curve of the CMOS inverter from FIG. 3A, according to one embodiment.

FIG. 3B is graph illustrating a voltage transfer function 320 of CMOS inverter circuit 300, according to one embodiment. When the voltage between gate node 306 and source node 316 (e.g., the input voltage signal $V_{IN}$) is less than the threshold voltage $V_{Tn}$, NMOS transistor 304 is turned off and PMOS transistor 302 operates as a PMOS triode providing the output voltage signal $V_{OUT}$ equal to $V_{DD}$, as shown by transfer function 320 for $V_{IN}$ less than $V_{Tn}$. Similarly, when the voltage between gate node 306 and source node 314 (e.g., a difference between $V_{IN}$ and $V_{DD}$) is larger than the threshold voltage $V_{Tp}$, PMOS transistor 302 is turned off and NMOS transistor 304 operates as a NMOS triode providing the output voltage signal $V_{OUT}$ equal to zero, as shown by transfer function 320 for $V_{IN} > V_{DD} + V_{Tp}$.

For some values of the input voltage signal $V_{IN}$ greater than the threshold voltage $V_{Tn}$, NMOS transistor 304 operates in the saturation mode and PMOS transistor 302 still operates as the PMOS triode. In such case, the output voltage signal $V_{OUT}$ becomes smaller than $V_{DD}$, as shown by transfer function 320 of FIG. 3B for $V_{IN}$ greater than $V_{Tn}$. Similarly, when the voltage between gate node 306 and source node 314 (e.g., the difference between $V_{IN}$ and $V_{DD}$) is smaller than the threshold voltage $V_{Tp}$ (e.g., $V_{IN} < V_{DD} + V_{Tp}$), PMOS transistor 302 operates in the saturation mode and NMOS transistor 304 still operates as the NMOS triode. In such case, the output voltage signal $V_{OUT}$ becomes greater than zero, as shown by transfer function 320 of FIG. 3B for $V_{IN} < V_{DD} + V_{Tp}$.

For at least a portion of the values of input voltage signal $V_{IN}$ between $V_{Tn}$ and $V_{DD} + V_{Tp}$, both PMOS transistor 302 and NMOS transistor 304 may be in the saturation mode and saturation currents may flow though both PMOS and NMOS transistors 302, 304 generating the output voltage signal $V_{OUT}$ having values between zero and $V_{DD}$, as shown by transfer function 320. After equating saturation currents of NMOS transistor 304 and PMOS transistor 302, the following stands:

$$\frac{1}{2}\mu_n C_{ox}\left(\frac{w}{l}\right)_n (V_m - V_{Tn})^2 = \frac{1}{2}\mu_p C_{ox}\left(\frac{w}{l}\right)_p (V_{DD} - V_m - |V_{Tp}|)^2 \quad (1)$$

where $\mu_n$ is an electron mobility of NMOS transistor 304, $\mu_p$ is a hole mobility of PMOS transistor 302, $C_{ox}$ is an oxide capacitance of PMOS and NMOS transistors 302 and 304 (e.g., same for both transistors), $(w/l)_n$ is an aspect ratio for NMOS transistor 304, $(w/l)_p$ is an aspect ratio for PMOS transistor 302, and $V_m$ is a switching threshold voltage of the input voltage signal $V_{IN}$ for which both PMOS transistor 302 and NMOS transistor 304 operate in saturation modes. The switching threshold voltage $V_m$ illustrated in FIG. 3B represents throughout this disclosure a switching threshold voltage of an inverter circuit (e.g., circuitry 208, CMOS inverter circuit 300, or any other inverter circuit in this disclosure).

After solving Eq. (1) for the switching threshold voltage $V_m$, the following stands:

$$V_m = \frac{V_{DD} - |V_{Tp}| + V_{Tn}k}{1+k} \text{ for } k = \sqrt{\frac{\mu_n\left(\frac{w}{l}\right)_n}{\mu_p\left(\frac{w}{l}\right)_p}} = \sqrt{\frac{\beta_n}{\beta_p}} \quad (2)$$

where $\beta_n$ is a transconductance parameter of NMOS transistor 304 and $\beta_p$ is a transconductance parameter of PMOS transistor 302. The transconductance parameters of NMOS and PMOS transistors 304 and 302 are defined as:

$$\beta_n = \mu_n C_{ox}\left(\frac{w}{l}\right)_n, \text{ and } \beta_p = \mu_p C_{ox}\left(\frac{w}{l}\right)_p \quad (3)$$

There are four distinct requirements for operation of the CMOS based inverter circuit: (i) the requirement for a programmable switching threshold voltage $V_m$ for adjusting a duty cycle distortion (DCD) across process skews; (ii) constant transconductance parameters $\beta_n$ and $\beta_p$ to ensure proper load driving, and rise/fall transitions of an inverter cell; (iii) temperature independence to simplify a calibration process of an inverter circuit and to ensure proper operation for variety of temperatures; and (iv) voltage supply independence to minimize the effect of voltage supply ripples and variations.

First, ensuring that the switching threshold voltage $V_m$ is programmable involves controlling the beta ratio k defined in Eq. (2). However, it can be observed from Eq. (2) that the switching threshold voltage $V_m$ is a non-linear function of k, which means that it is not possible to fulfill range/step size requirements for the switching threshold voltage $V_m$ using a programmable number or inverter branches. Second, ensuring that a transconductance parameter (e.g., a fall/rise transition time) is constant involves maintaining a constant beta ratio k. However, if k is varied to control a saturation switching point (e.g., the switching threshold voltage $V_m$), the transconductance parameter would vary, and rise/fall transition times of CMOS inverter circuit 300 would not be same or even similar.

Third, it can be shown that temperature dependency of CMOS inverter circuit 300 is not a function of the electron and hole mobilities. As a temperature increases, a mobility $\mu$ decreases, but the ratio $\mu_n/\mu_p$ is independent of temperature. Therefore, the temperature dependency reduces to:

$$\frac{dV_m}{dT} = \frac{-\frac{d|V_{Tp}|}{dT} + k\frac{dV_{Tn}}{dT}}{1+k} \quad (4)$$

Given that $$\frac{d|V_{Tp}|}{dT} \approx \frac{dV_{Tn}}{dT} \approx 1,$$

keeping k=1 would eliminate the temperature dependency.

Fourth, dependency on ripples and variations of the voltage supply $V_{DD}$ can be analyzed using an error signal ε that can be defined as a difference between the switching threshold voltage $V_m$ and a half of $V_{DD}$. Thus, the error signal ε equal to zero corresponds to the case when the saturation switching point (e.g., switching threshold voltage $V_m$) is equal to $V_{DD}/2$ and DCD is minimized as rising and falling transition times of CMOS inverter circuit 300 are the same. As $$\varepsilon = \frac{V_{DD}}{2} - V_m,$$

dependency of the error signal ε on changes of supply voltage $V_{DD}$ is given by:

$$\frac{d\varepsilon}{dV_{DD}} = \frac{1}{2} - \frac{dV_m}{dV_{DD}} \quad (5)$$

From Eq. (2), $$\frac{dV_m}{dV_{DD}} = \frac{1}{1+k}.$$

Then, Eq. (5) becomes:

$$\frac{d\varepsilon}{dV_{DD}} = \frac{1}{2} - \frac{1}{1+k} \quad (6)$$

Thus, the dependency of error signal ε on changes of $V_{DD}$ becomes zero for k=1.

To summarize, the switching threshold voltage $V_m$ would be programmable if the beta ratio k can be programmed over a large range (e.g., one or two orders of magnitude). The constant transconductance parameter requires that the beta ratio k is constant, whereas to eliminate temperature and voltage supply dependency the beta ratio k that is equal to one is required. Programming a defined number of CMOS transistors in series/parallel and degenerating the transistors using switches or resistors would violate the aforementioned criteria and would involve a continuous trimming for functionality. The solution is to build a CMOS based inverter circuit with more degrees of freedom to program the switching threshold voltage $V_m$ and the beta ratio k independently. Details about a structure of CMOS based inverter circuit (e.g., circuitry 208) that fulfils the four aforementioned criteria are provided below in relation to FIG. 4 and FIGS. 5A-5D.

Example Architecture of Voltage Supply and Temperature Independent Circuitry

In accordance with embodiments of the present disclosure, circuitry 208 that fulfils the aforementioned four criteria includes multiple CMOS transistors connected in parallel (e.g., transistors with a common gate node and a common source node) and having different threshold voltages $V_T$. Thus, circuitry 208 that operates as a CMOS inverter may include PMOS transistors with different threshold voltages $V_T$ mutually connected with each other in parallel, and NMOS transistors with different threshold voltages $V_T$ mutually connected with each other in parallel. In general, circuitry 208 may include $n_l$ transistors (PMOS/NMOS transistors) with a lower threshold voltage $V_{T,l}$ connected in parallel with $n_h$ transistors (PMOS/NMOS transistors) with a higher threshold voltage $V_{T,h}$. As an equivalent transconductance of parallel transistors is equal to a sum of transconductances of individual transistors, the following holds:

$$\mu_{eq}\left(\frac{w}{l}\right)_{eq}(V_{GS} - V_{T,eq}) = n_l\mu_l\left(\frac{w}{l}\right)_l(V_{GS} - V_{T,l}) + n_h\mu_h\left(\frac{w}{l}\right)_h(V_{GS} - V_{T,h}) \quad (7)$$

where $\mu_{eq}$ is an equivalent mobility of electrons/holes of the parallel NMOS/PMOS transistors, $(w/l)_{eq}$ is an equivalent aspect ratio for the parallel transistors, $V_{T,eq}$ is an equivalent threshold voltage for the parallel transistors, $\mu_l$ is a mobility of electrons/holes of a CMOS transistor (NMOS/PMOS transistor) with the lower threshold voltage, $(w/l)_l$ is an aspect ratio for the CMOS transistor with the lower threshold voltage, $\mu_h$ is a mobility of electrons/holes of a CMOS transistor (NMOS/PMOS transistor) with the higher threshold voltage, $(w/l)_h$ is an aspect ratio for the CMOS transistor with the higher threshold voltage, and $V_{GS}$ is a voltage level between the common gate node and the common source node.

After rearranging Eq. (7), the following holds:

$$\mu_{eq}\left(\frac{w}{l}\right)_{eq}(V_{GS} - V_{T,eq}) = \left[n_l\mu_l\left(\frac{w}{l}\right)_l + n_h\mu_h\left(\frac{w}{l}\right)_h\right] \left(V_{GS} - \frac{n_h\mu_h\left(\frac{w}{l}\right)_h V_{T,h} + n_l\mu_l\left(\frac{w}{l}\right)_l V_{T,l}}{n_h\mu_h\left(\frac{w}{l}\right)_h + n_l\mu_l\left(\frac{w}{l}\right)_l}\right) \quad (8)$$

Eq. (8) can be rewritten as:

$$\beta_{eq}(V_{GS} - V_{T,eq}) = [n_l\beta_l + n_h\beta_h]\left(V_{GS} - \frac{n_h\beta_h V_{T,h} + n_l\beta_l V_{T,l}}{n_h\beta_h + n_l\beta_l}\right), \quad (9)$$

where $\beta_{eq}$ is an equivalent transconductance parameter of the parallel transistors, $\beta_l$ is a transconductance parameter of the CMOS transistor with the lower threshold voltage, and $\beta_h$ is a transconductance parameter of the CMOS transistor with the higher threshold voltage.

Figure 4:
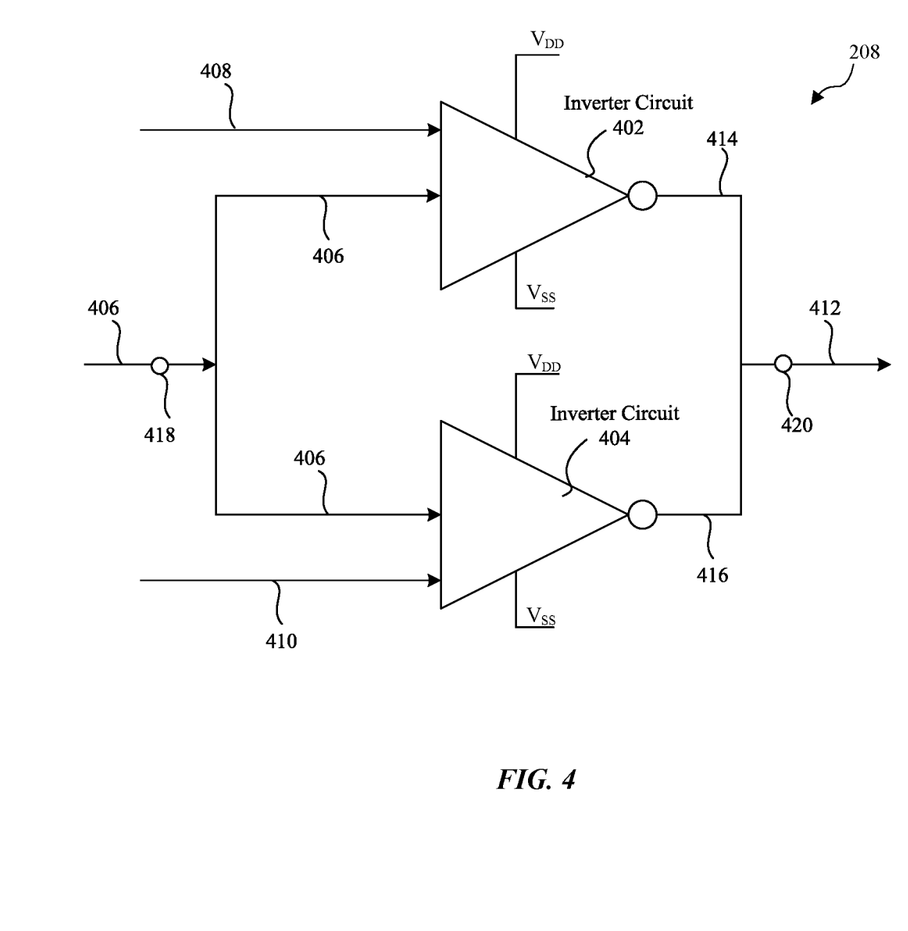
FIG. 4 is a block diagram of a CMOS inverter circuitry included in the electronic device, according to one embodiment.

FIG. 4 is a block diagram of circuitry 208, according to one embodiment. Circuitry 208 includes an input node 418 configured to receive an input voltage signal 406, and an output node 420 configured to output an output voltage signal 412 generated by components of circuitry 208. Circuitry 208 further includes an inverter circuit 402 of a first switching threshold voltage (e.g., $V_{m,1}$), and an inverter circuit 404 of a second switching threshold voltage (e.g., $V_{m,2}$) different than the first switching threshold voltage, e.g., lower than the first switching threshold voltage. Both inverter circuits 402, 404 are coupled to the same upper voltage supply $V_{DD}$ (e.g., greater than 0 V) and the same lower power supply $V_{SS}$ (e.g., equal to or less than 0 V).

To fulfil the aforementioned four criteria, circuitry 208 may include $n_{p,h}$ PMOS transistors of inverter circuit 402 enabled having, e.g., a high threshold voltage $V_{Tp,h}$ and connected in parallel with $n_{p,l}$ PMOS transistors of inverter circuit 404 enabled having, e.g., a low threshold voltage $V_{Tp,l}$. Circuitry 208 may further include $n_{n,h}$ NMOS transistors of inverter circuit 402 turned on having, e.g., a high threshold voltage $V_{Tn,h}$ and connected in parallel with $n_{n,l}$ NMOS transistors of inverter circuit 404 enabled having, e.g., a low threshold voltage $V_{Tn,l}$. Inverter circuit 402 may have an equivalent switching threshold voltage (e.g., $V_{m,h}$) higher than an equivalent switching threshold voltage (e.g., $V_{m,l}$) of inverter circuit 404.

After replacing $V_{Tp}$ in Eq. (2) with $V_{T,eq}$ from Eq. (9) for $[n_{p,h}+n_{p,l}]$ parallel PMOS transistors and replacing $V_{Tn}$ in Eq. (2) with $V_{T,eq}$ from Eq. (9) for $[n_{n,h}+n_{n,l}]$ parallel NMOS transistors, Eq. (2) becomes:

$$V_m = \frac{V_{DD} - \frac{aV_{Tp,h} + bV_{Tp,l}}{a+b} + \frac{cV_{Tn,h} + dV_{Tn,l}}{c+d}k}{1+k} \text{ for } k = \sqrt{\frac{c+d}{a+b}}, \quad (10)$$

with $a=n_{p,h}\beta_{p,h}$, $b=n_{p,l}\beta_{p,l}$, $c=n_{n,h}\beta_{n,h}$, and $d=n_{n,l}\beta_{n,l}$, where $\beta_{p,h}$ is a transconductance parameter of the PMOS transistor with the threshold voltage $V_{Tp,h}$, $\beta_{p,l}$ is a transconductance parameter of the PMOS transistor with the threshold voltage $V_{Tp,l}$, $\beta_{n,h}$ is a transconductance parameter of the NMOS transistor with the threshold voltage $V_{Tn,h}$, and $\beta_{n,l}$ is a transconductance parameter of the NMOS transistor with the threshold voltage $V_{Tn,l}$. A detailed structure of circuitry 208 providing the switching threshold voltage $V_m$ as defined by Eq. (10) is described in relation to FIGS. 5A-5D.

Inverter circuit 402 is connected between input node 418 and output node 420. Inverter circuit 402 includes a set of one or more core circuits 510 illustrated in FIG. 5B where each core circuit 510 includes a CMOS transistor (e.g., PMOS transistor) of a first type (e.g., of a first threshold voltage) and a CMOS transistor (e.g., NMOS transistor) of a second type (e.g., of a second threshold voltage) having a first common gate node connected to input node 418 and a first common drain node connected to output node 420. Core circuits 510 of inverter circuit 402 can be enabled or disabled by enable signals 408. Inverter circuit 402 generates an output signal 414 by applying input voltage signal 406 to one or more core circuits 510.

Inverter circuit 404 is also placed between input node 418 and output node 420 in parallel with inverter circuit 402. Inverter circuit 404 includes a set of one or more core circuits 520 illustrated in FIG. 5C where each core circuit 520 includes a CMOS transistor (e.g., PMOS transistor) of a third type (e.g., of a third threshold voltage) different than the first type and a CMOS transistor (e.g., NMOS transistor) of a fourth type (e.g., of a fourth threshold voltage) different than the second type. The CMOS transistors of the third and fourth types have a second common gate node connected to input node 418 and a second common drain node connected to output node 420. Core circuits 520 of inverter circuit 404 can be enabled (e.g., turned on) or disabled (e.g., turned off) by enable signals 410. Inverter circuit 404 generates an output signal 416 by applying input voltage signal 406 to one or more core circuits 520. Circuitry 208 generates output voltage signal 412 at output node 420 by combining output signal 414 and output signal 416. Inverter circuits 402 and 404 operate in contention within circuitry 208 to generate output voltage signal 412.

Figure 5A:
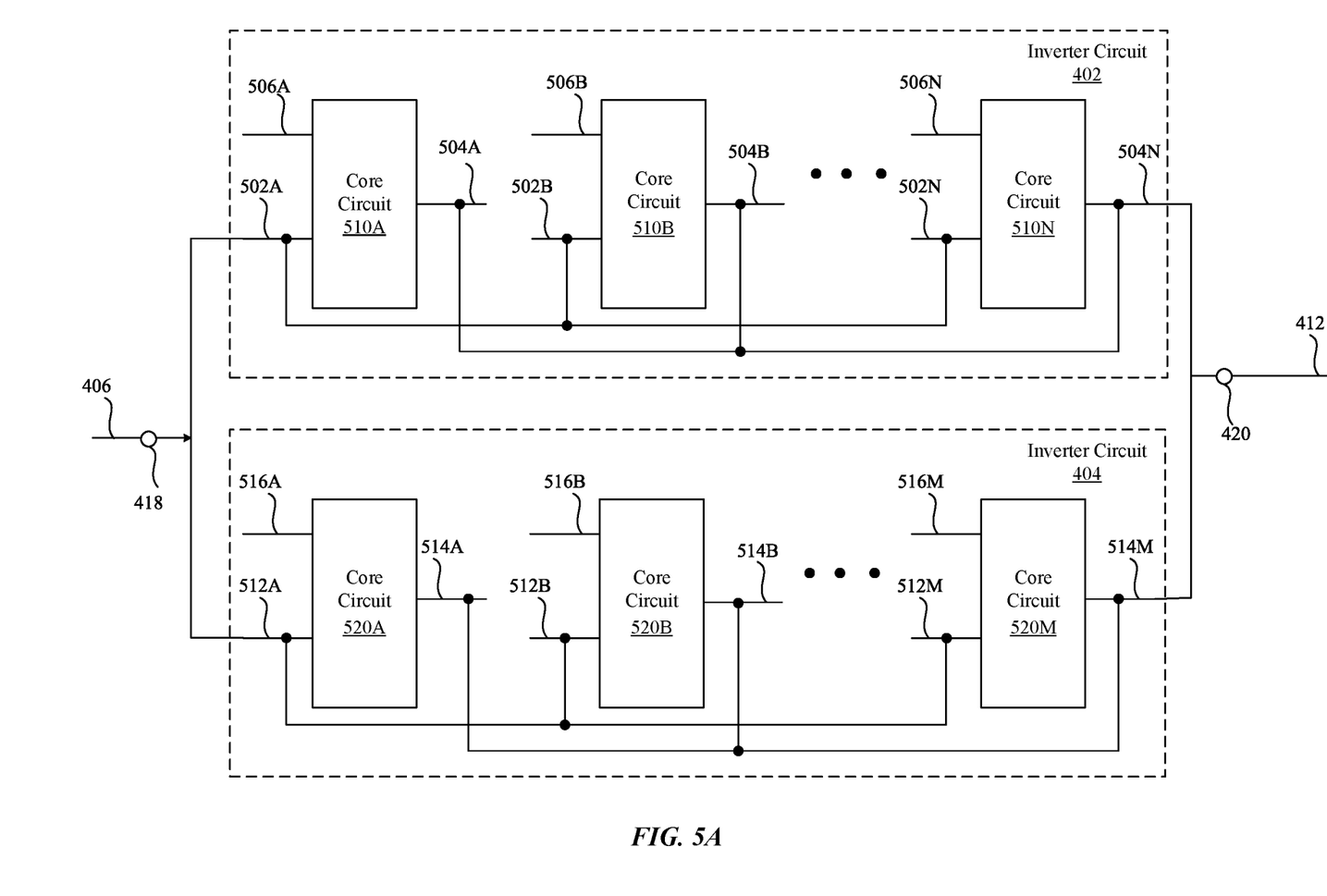
FIG. 5A is a block diagram of inverter circuits of the circuitry of FIG. 4, according to one embodiment.

FIG. 5A is a detailed block diagram of inverter circuits 402, 404, according to one embodiment. Both inverter circuits 402, 404 are connected between input node 418 that receives input voltage signal 406 and output node 420 at which output voltage signal 412 is generated.

Figure 5B:
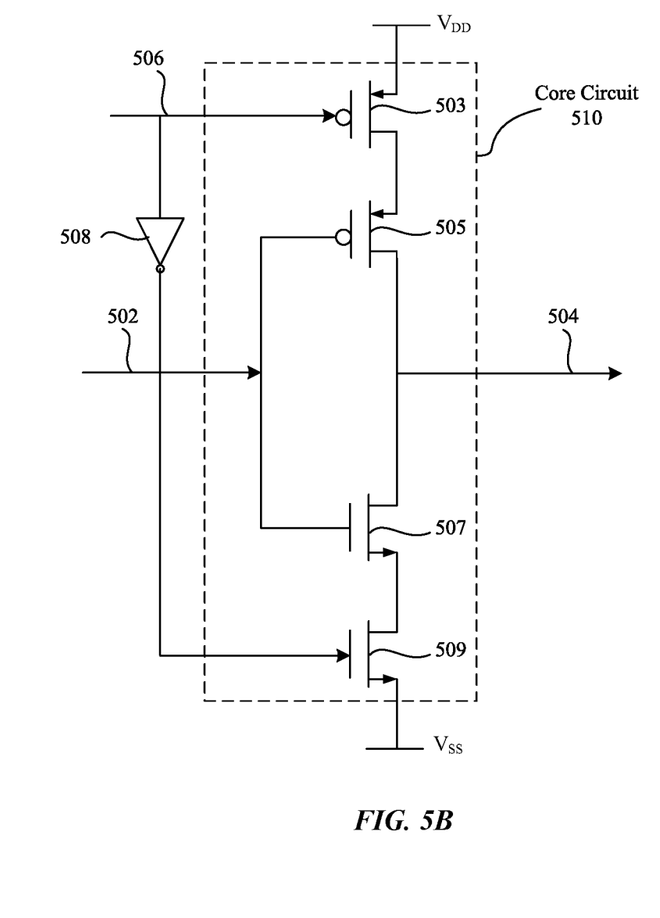
FIG. 5B is a circuit diagram of a core circuit of one inverter circuit of FIG. 5A, according to one embodiment.

Inverter circuit 402 includes identical core circuits 510A, 510B, through 510N (e.g., N=16) illustrated in more detail in FIG. 5B. Core circuits 510A, 510B, through 510N are connected in parallel, e.g., input nodes 502A, 502B through 502N are connected to a common node (e.g., input node 418) and output nodes 504A, 504B through 504N are connected to another common node (e.g., output node 420). Each core circuit 510A, 510B, through 510N can be enabled or disabled using a corresponding enable signal 506A, 506B, through 506N generated by e.g., a decoding circuit 524 of FIG. 5D.

Figure 5C:
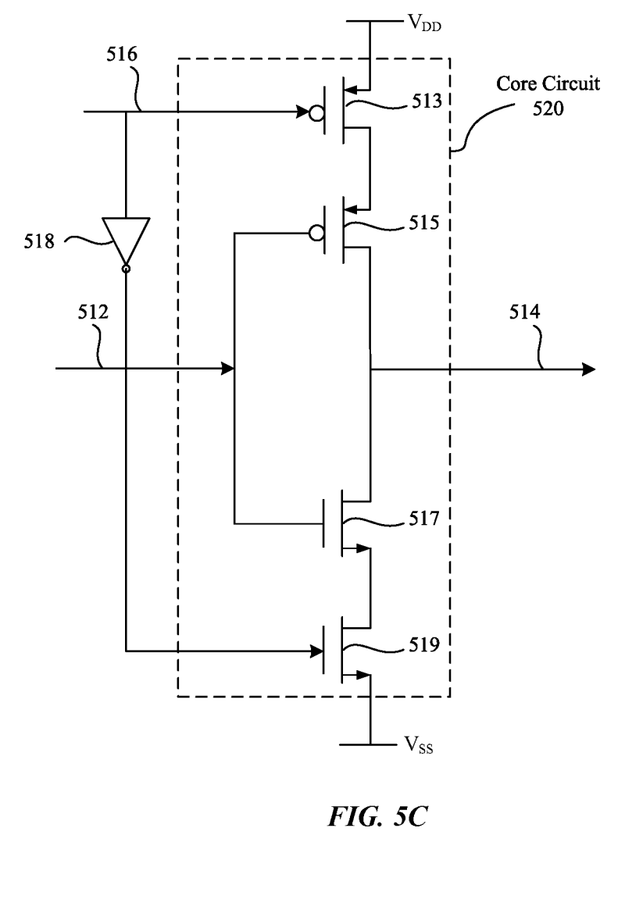
FIG. 5C is a circuit diagram of a core circuit of another inverter circuit from FIG. 5A, according to one embodiment.

Inverter circuit 404 includes identical core circuits 520A, 520B, through 520M (e.g., M=16 or M≠N) illustrated in more detail in FIG. 5C. Core circuits 520A, 520B, through 520M are connected in parallel, e.g., input nodes 512A, 512B through 512M are connected to a common node (e.g., input node 418) and output nodes 514A, 514B through 514M are connected to another common node (e.g., output node 420). Each core circuit 520A, 520B, through 520M can be enabled or disabled using a corresponding enable signal 516A, 516B, through 516M generated by e.g., decoding circuit 524.

FIG. 5B is a circuit diagram of core circuit 510 of inverter circuit 402, according to one embodiment. Core circuit 510 is a CMOS inverter having a PMOS transistor 505 and an NMOS transistor 507 having their gates connected to input node 502 and drains connected to output node 504. PMOS transistor 505 may be of the first type having the transconductance parameter of $\beta_{p,l}$ and the threshold voltage $V_{Tp,l}$, as defined in relation to Eq. (10). In one or more embodiments, PMOS transistor 505 may be implemented as a low threshold voltage transistor, e.g., the threshold voltage $V_{Tp,l}$ may be lower than a first voltage value. NMOS transistor 507 may be of the second type having the transconductance parameter $\beta_{n,h}$ and the threshold voltage $V_{Tn,h}$, as defined in relation to Eq. (10). In one or more embodiments, NMOS transistor 507 may be implemented as a high threshold voltage transistor, e.g., the threshold voltage $V_{m,h}$ may be higher than a second voltage value. Core circuit 510 has a switching threshold voltage $V_{m,h}$, and the subscript "h" denotes that core circuit 510 belonging to inverter circuit 402 has a switching threshold voltage (e.g., $V_{m,h}$) that may be higher than a switching threshold voltage (e.g., $V_{m,l}$) of core circuit 520 belonging to inverter circuit 404.

PMOS transistor 505 is coupled to supply voltage $V_{DD}$ via a PMOS switch 503, and NMOS transistor 507 is coupled to supply voltage $V_{SS}$ via an NMOS switch 509. Enable signal 506 may be sent directly to a gate node of PMOS switch 503 and via a logic inverter 508 to a gate node of NMOS switch 509 to enable or disable core circuit 510. Enable signal 506 may be generated by decoding circuit 524. One or more core circuits 510 of FIG. 5B connected within inverter circuit 402 as illustrated in FIG. 5A and including one or more PMOS transistors of the first type and one or more NMOS transistors of the second type provide the first switching threshold voltage (e.g., $V_{m,l}$ or $V_{m,h}$) of inverter circuit 402 as defined by Eq. (10).

FIG. 5C is a circuit diagram of core circuit 520 of inverter circuit 404, according to one embodiment. Core circuit 520 is a CMOS inverter having a PMOS transistor 515 and an NMOS transistor 517 having their gates connected to input node 512 and drains connected to output node 514. PMOS transistor 515 may be of the third type having the transconductance parameter $\beta_{p,h}$ and the threshold voltage $V_{Tp,h}$, as defined in relation to Eq. (10). In one or more embodiments, PMOS transistor 515 is implemented as a high threshold voltage transistor, e.g., the threshold voltage $V_{Tp,h}$ may be higher than a third voltage value. NMOS transistor 517 may be of the fourth type having the transconductance parameter $\beta_{n,l}$ and the threshold voltage $V_{Tn,l}$, as defined in relation to Eq. (10). In one or more embodiments, NMOS transistor 517 is implemented as a low threshold voltage transistor, e.g., the threshold voltage $V_{Tn,l}$ may be lower than a fourth voltage value. Core circuit 520 has a switching threshold voltage $V_{m,l}$, and the subscript "l" denotes that core circuit 520 belonging to inverter circuit 404 has a switching threshold voltage (e.g., $V_{m,l}$) that may be lower than a switching threshold voltage (e.g., $V_{m,h}$) of core circuit 510 belonging to inverter circuit 402. Also, inverter circuit 402 has the first switching threshold voltage (e.g., $V_{m,l}=V_{m,h}$) that may be higher than the second switching threshold voltage (e.g., $V_{m,2}=V_{m,l}$) of inverter circuit 404.

PMOS transistor 515 is coupled to supply voltage $V_{DD}$ via a PMOS switch 513, and NMOS transistor 507 is coupled to supply voltage $V_{SS}$ via an NMOS switch 519. Enable signal 516 may be sent directly to a gate node of PMOS switch 513 and via a logic inverter 518 to a gate node of NMOS switch 519 to enable or disable core circuit 520. Enable signal 516 may be generated by decoding circuit 524. One or more core circuits 520 of FIG. 5C connected within inverter circuit 404 as illustrated in FIG. 5A and including one or more PMOS transistors of the third type and one or more NMOS transistors of the fourth type provide the second switching threshold voltage (e.g., $V_{m,2}$ or $V_{m,l}$) as defined by Eq. (10) that is different than the first switching threshold voltage (e.g., $V_{m,l}$ or $V_{m,h}$) of inverter circuit 402, e.g., lower than the first switching threshold voltage.

Figure 5D:
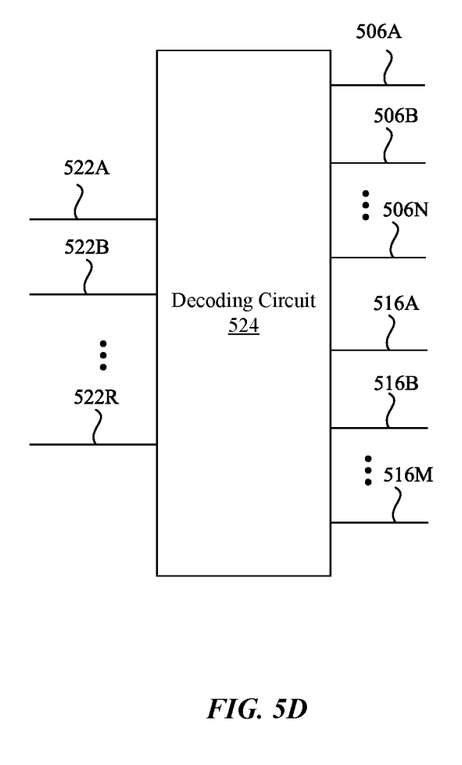
FIG. 5D is a block diagram of a decoding circuit for enabling and disabling core circuits of the inverter circuits from FIG. 5A, according to one embodiment.

FIG. 5D is a block diagram of decoding circuit 524, according to one embodiment. Decoding circuit 524 is a decoding logic that generates enable signals 506A, 506B through 506N and enable signals 516A, 516B through 516M by decoding input signals 522A, 522B through 522R. Decoding circuit 524 is coupled to core circuits 510A, 510B through 510N via enable signals 506A, 506B through 506N, which enable or disable corresponding core circuits 510A, 510B through 510N and their PMOS/NMOS transistors. In one or more embodiments, decoding circuit 524 generates enable signals 506A, 506B through 506N such that $n_{p,l}$ instances of PMOS transistors 505 ($n_{p,l} \leq N$) and $n_{n,h}$ instances of NMOS transistors 507 ($n_{n,h} \leq N$) of inverter circuit 402 are enabled. Similarly, decoding circuit 524 is coupled to core circuits 520A, 520B through 520M via enable signals 516A, 516B through 516M, which enable or disable corresponding core circuits 520A, 520B through 520M and their PMOS/NMOS transistors. In one or more embodiments, decoding circuit 524 generates enable signals 516A, 516B through 516M such that $n_{p,h}$ instances of PMOS transistors 515 ($n_{p,h} \leq M$) and $n_{n,l}$ instances of NMOS transistors 517 ($n_{n,l} \leq M$) of inverter circuit 404 are enabled.

By generating corresponding enable signals 506A, 506B through 506N and 516A, 516B through 516M, decoding circuit 524 provides that a+b=c+d, where a, b, c and d are defined in relation to Eq. (10). By providing that a+b=c+d, decoding circuit 524 ensures that the beta ratio k as defined in Eq. (10) is equal to 1, which means that circuitry 208 is temperature independent as well independent of voltage supply ripples and variations. Furthermore, circuitry 208 designed as illustrated in FIG. 4 and FIGS. 5A-5D has the equivalent switching threshold voltage $V_m$ as defined by Eq. (10) with a programmable range which is achieved by employing PMOS and NMOS transistors of various threshold voltages. Circuitry 208 includes CMOS transistors of four different threshold voltages (e.g., $V_{Tp,h}$, $V_{Tn,h}$, $V_{Tp,l}$, $V_{Tn,l}$) for, e.g., PMOS transistors of the first type, NMOS transistors of the second type, PMOS transistors of the third type, and NMOS transistors of the fourth type. In some embodiments, decoding circuit 524 generates enable signals 506A, 506B through 506N and 516A, 516B through 516M such that a sum of a number of core circuits 510 of inverter circuit 402 that are enabled (e.g., $N_E$) and a number of core circuits 520 of inverter circuit 404 that are enabled (e.g., $M_E$) is constant and set during the calibration process to e.g., $N_E+M_E=16$. This ensures that transconductance parameters (e.g., transition times) of inverter circuits 402, 404 in circuitry 208 are also constant.

Example Operation of Supply and Temperature Independent Circuitry

Figure 6:
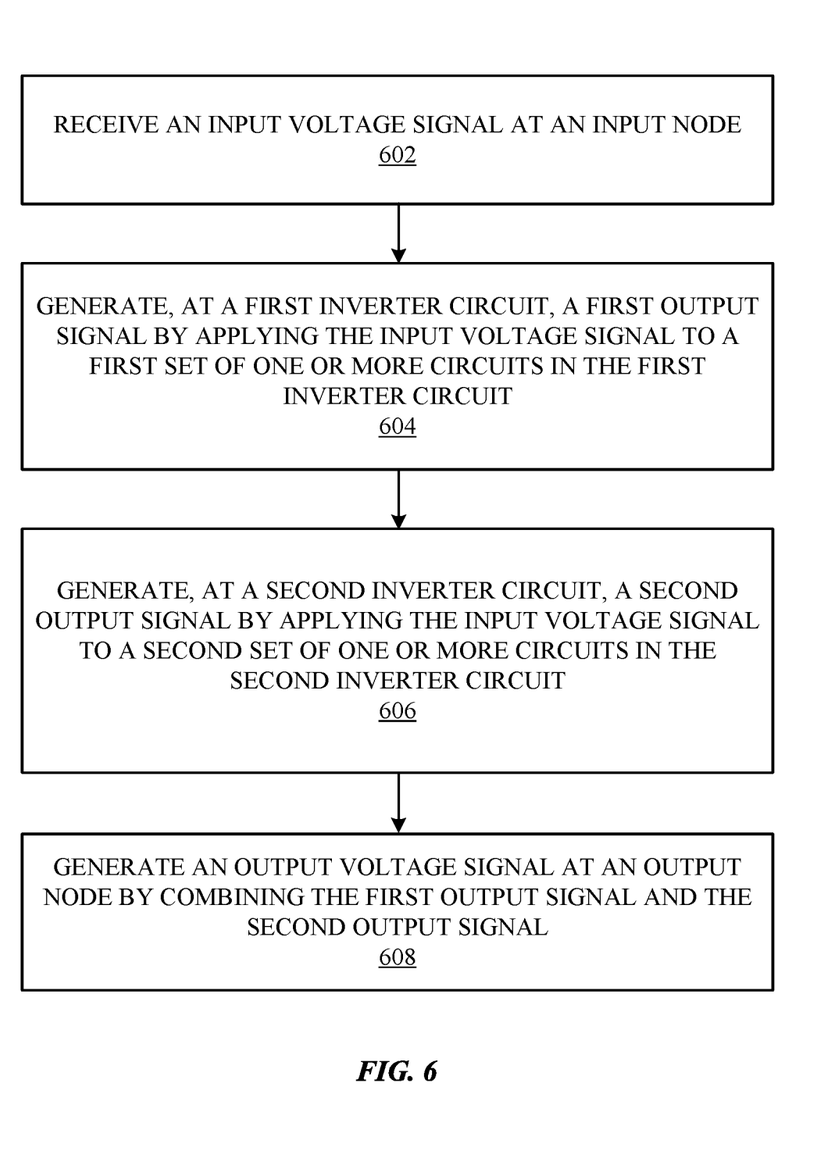
FIG. 6 is a flowchart illustrating a process of operating a circuitry with a pair of CMOS based inverter circuits, according to one embodiment.

FIG. 6 is a flowchart illustrating a process of operating circuitry 208, according to one embodiment. The process illustrated in FIG. 6 can be performed by components of circuitry 208 of electronic device 100, such as inverter circuit 402 and inverter circuit 404 having the structure as illustrated in FIGS. 5A-5D.

Circuitry 208 receives 602 an input voltage signal at an input node. Circuitry 208 generates 604, at a first inverter circuit (e.g., inverter circuit 402) of a first switching threshold voltage (e.g., $V_{m,l}$ or $V_{m,h}$) connected between the input node and an output node, a first output signal by applying the input voltage signal to a first set of one or more core circuits (e.g., core circuits 510) each of which includes a CMOS transistor of a first type (e.g., PMOS transistor 505) and a CMOS transistor of a second type (e.g., NMOS transistor 507) having a first common gate node connected to the input node and a first common drain node connected to the output node.

Circuitry 208 generates 606, at a second inverter circuit (e.g., inverter circuit 404) of a second switching threshold voltage (e.g., $V_{m,2}$ or $V_{m,l}$) lower than the first switching threshold voltage connected between the input node and the output node, a second output signal by applying the input voltage signal to a second set of one or more core circuits (e.g. core circuits 520) each of which includes a CMOS transistor of a third type (e.g., PMOS transistor 515) and a CMOS transistor of a fourth type (e.g., NMOS transistor 517) having a second common gate node connected to the input node and a second common drain node connected to the output node. Circuitry 208 generates 608 an output voltage signal at the output node by combining the first output signal and the second output signal.

The processes and their sequences illustrated in FIG. 6 are merely illustrative. Additional processes may be added and some processes in FIG. 6 may be omitted.

The above embodiments were described primarily in the context of receiver circuit associated with an interfacing bus. However, the same principle can be applied to other circuits such as voltage detection circuits.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A circuitry for digital data communication, the circuitry comprising:
   an input node configured to receive an input voltage signal;
   an output node configured to output an output voltage signal;
   a first inverter circuit of a first switching threshold voltage, the first inverter circuit connected between the input node and the output node, the first inverter circuit including a first set of one or more core circuits, each core circuit of the first set including a complementary metal-oxide-semiconductor (CMOS) transistor of a first type and a CMOS transistor of a second type having a first common gate node connected to the input node and a first common drain node connected to the output node; and a second inverter circuit of a second switching threshold voltage lower than the first switching threshold voltage, the second inverter circuit connected between the input node and the output node, the second inverter circuit including a second set of one or more core circuits, each core circuit of the second set including a CMOS transistor of a third type and a CMOS transistor of a fourth type having a second common gate node connected to the input node and a second common drain node connected to the output node.

2. The circuitry of claim 1, wherein:
a threshold voltage of the CMOS transistor of the first type is different than a threshold voltage of the CMOS transistor of the third type, and
a threshold voltage of the CMOS transistor of the second type is different than a threshold voltage of the CMOS transistor of the fourth type.

3. The circuitry of claim 1, wherein the first set of core circuits and the second set of core circuits are programmable to be enabled or disabled.

4. The circuitry of claim 1, wherein a sum of a first number and a second number is constant and set to a predetermined number, the first number representing a number of core circuits in the first set that are enabled, and the second number representing a number of core circuits in the second set that are enabled.

5. The circuitry of claim 1, further comprising a decoding circuit coupled to the first set of core circuits and the second set of core circuits, the decoding circuit configured to generate enable signals that enable or disable each of the core circuits in the first set and the core circuits in the second set.

6. The circuitry of claim 1, wherein:
a first sum of a first product and a second product is the same as a second sum of a third product and a fourth product,
the first product representing a number of one or more CMOS transistors of the first type enabled in the first inverter circuit multiplied with a transconductance parameter of the CMOS transistor of the first type,
the second product representing a number of one or more CMOS transistors of the third type enabled in the second inverter circuit multiplied with a transconductance parameter of the CMOS transistor of the third type,
the third product representing a number of one or more CMOS transistors of the second type enabled in the first inverter circuit multiplied with a transconductance parameter of the CMOS transistor of the second type, and
the fourth product representing a number of one or more CMOS transistors of the fourth type enabled in the second inverter circuit multiplied with a transconductance parameter of the CMOS transistor of the fourth type.

7. The circuitry of claim 6, further comprising a decoding circuit configured to:
generate a first enable signal enabling the number of one or more CMOS transistors of the first type and the number of one or more CMOS transistors of the second type in the first inverter circuit; and
generate a second enable signal enabling the number of one or more CMOS transistors of the third type and the number of one or more CMOS transistors of the fourth type in the second inverter circuit, the first enable signal and the second enable signal causes the first sum to be equal to the second sum.

8. The circuitry of claim 1, wherein the CMOS transistor of the first type is a low threshold voltage P-type MOS (PMOS) transistor, the CMOS transistor of the second type is a high threshold voltage N-type MOS (NMOS) transistor, the CMOS transistor of the third type is a high threshold voltage PMOS transistor, and the CMOS transistor of the fourth type is a low threshold voltage NMOS transistor.

9. The circuitry of claim 1, wherein:
the first set of one or more core circuits comprises a first plurality of core circuits, each core circuit of the first plurality connected between the input node and the output node, and
the second set of one or more core circuits comprises a second plurality of core circuits, each core circuit of the second plurality connected between the input node and the output node.

10. A method comprising:
receiving an input voltage signal at an input node;
generating, at a first inverter circuit of a first switching threshold voltage connected between the input node and an output node, a first output signal by applying the input voltage signal to a first set of one or more core circuits each of which includes a complementary metal-oxide-semiconductor (CMOS) transistor of a first type and a CMOS transistor of a second type having a first common gate node connected to the input node and a first common drain node connected to the output node;
generating, at a second inverter circuit of a second switching threshold voltage lower than the first switching threshold voltage connected between the input node and the output node, a second output signal by applying the input voltage signal to a second set of one or more core circuits each of which includes a CMOS transistor of a third type and a CMOS transistor of a fourth type having a second common gate node connected to the input node and a second common drain node connected to the output node; and
generating an output voltage signal at the output node by combining the first output signal and the second output signal.

11. The method of claim 10, wherein:
a threshold voltage of the CMOS transistor of the first type is different than a threshold voltage of the CMOS transistor of the third type, and
a threshold voltage of the CMOS transistor of the second type is different than a threshold voltage of the CMOS transistor of the fourth type.

12. The method of claim 10, further comprising:
programming one or more of the first set of core circuits and one or more of the second set of core circuits to be disabled.

13. The method of claim 10, wherein a first number of core circuits in the first set and a second number of core circuits in the second first set are enabled, a sum of the first number and the second number being constant and set to a predetermined number.

14. The method of claim 10, further comprising:
generating enable signals that enabled or disabled each of the core circuits in the first set and the core circuits in the second set.

15. The method of claim 10, wherein:
a first sum of a first product and a second product is the same as a second sum of a third product and a fourth product,
the first product representing a number of one or more CMOS transistors of the first type enabled in the first inverter circuit multiplied with a transconductance parameter of the CMOS transistor of the first type,
the second product representing a number of one or more CMOS transistors of the third type enabled in the second inverter circuit multiplied with a transconductance parameter of the CMOS transistor of the third type,
the third product representing a number of one or more CMOS transistors of the second type enabled in the first inverter circuit multiplied with a transconductance parameter of the CMOS transistor of the second type, and
the fourth product representing a number of one or more CMOS transistors of the fourth type enabled in the second inverter circuit multiplied with a transconductance parameter of the CMOS transistor of the fourth type.

16. The method of claim 15, further comprising:
generating a first enable signal to enable the number of one or more CMOS transistors of the first type and the number of one or more CMOS transistors of the second type in the first inverter circuit; and
generating a second enable signal to enable the number of one or more CMOS transistors of the third type and the number of one or more CMOS transistors of the fourth type in the second inverter circuit.

17. The method of claim 10, wherein the CMOS transistor of the first type is a low threshold voltage P-type MOS (PMOS) transistor, the CMOS transistor of the second type is a high threshold voltage N-type MOS (NMOS) transistor, the CMOS transistor of the third type is a high threshold voltage PMOS transistor, and the CMOS transistor of the fourth type is a low threshold voltage NMOS transistor.

18. The method of claim 10, wherein:
the first set of one or more core circuits comprises a first plurality of core circuits, each core circuit of the first plurality connected between the input node and the output node, and
the second set of one or more core circuits comprises a second plurality of core circuits, each core circuit of the second plurality connected between the input node and the output node.

19. An electronic device, comprising:
an interfacing bus;
a first integrated circuit connected to the interfacing bus; and
a second integrated circuit connected to the interfacing bus, the second integrated circuit comprising a circuitry, the circuitry comprising:
an input node configured to receive an input voltage signal,
an output node configured to output an output voltage signal,
a first inverter circuit of a first switching threshold voltage, the first inverter circuit connected between the input node and the output node, the first inverter circuit including a first set of one or more core circuits, each core circuit of the first set including a complementary metal-oxide-semiconductor (CMOS) transistor of a first type and a CMOS transistor of a second type having a first common gate node connected to the input node and a first common drain node connected to the output node, and
a second inverter circuit of a second switching threshold voltage lower than the first switching threshold voltage, the second inverter circuit connected between the input node and the output node, the second inverter circuit including a second set of one or more core circuits, each core circuit of the second set including a CMOS transistor of a third type and a CMOS transistor of a fourth type having a second common gate node connected to the input node and a second common drain node connected to the output node.

20. The electronic device of claim 19, wherein:
a threshold voltage of the CMOS transistor of the first type is different than a threshold voltage of the CMOS transistor of the third type,
a threshold voltage of the CMOS transistor of the second type is different than a threshold voltage of the CMOS transistor of the fourth type,
the first set of core circuits and the second set of core circuits are programmable to be enabled or disabled, and
a sum of a first number and a second number is constant and set to a predetermined number, the first number representing core circuits in the first set that are enabled, and the second number representing core circuits in the second set that are enabled.

* * * * *